(12) United States Patent
Azzouz et al.

(10) Patent No.: US 12,341,177 B2
(45) Date of Patent: Jun. 24, 2025

(54) DEVICE FOR THERMAL PROCESSING OF AN ELECTRICAL ELEMENT LIABLE TO GET HOT AND METHOD IMPLEMENTING THE THERMAL PROCESSING DEVICE

(71) Applicant: Valeo Systemes Thermiques, Le Mesnil Saint Denis (FR)

(72) Inventors: Kamel Azzouz, Le Mesnil Saint Denis (FR); Imad Chelali, Le Mesnil Saint Denis (FR); Amrid Mammeri, Le Mesnil Saint Denis (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 1052 days.

(21) Appl. No.: 17/294,284

(22) PCT Filed: Sep. 19, 2019

(86) PCT No.: PCT/FR2019/052190
§ 371 (c)(1),
(2) Date: Dec. 17, 2021

(87) PCT Pub. No.: WO2020/099740
PCT Pub. Date: May 22, 2020

(65) Prior Publication Data
US 2022/0102782 A1 Mar. 31, 2022

(30) Foreign Application Priority Data
Nov. 16, 2018 (FR) ........................................ 1860652

(51) Int. Cl.
*H01M 10/613* (2014.01)
*F28D 1/03* (2006.01)
(Continued)

(52) U.S. Cl.
CPC ........ *H01M 10/6569* (2015.04); *F28D 1/035* (2013.01); *H01M 10/613* (2015.04);
(Continued)

(58) Field of Classification Search
CPC ........... H01M 10/6569; H01M 10/613; H01M 10/625; H01M 10/6556; H05K 7/20218; F28D 1/035
See application file for complete search history.

(56) References Cited

U.S. PATENT DOCUMENTS 5,943,211 A 8/1999 Havey et al.
2017/0179551 A1 6/2017 Shepard et al.

FOREIGN PATENT DOCUMENTS

CN 1225232 A 8/1999
CN 101534627 A 9/2009
(Continued)

OTHER PUBLICATIONS

International Search Report with Written Opinion in corresponding International Application No. PCT/FR2019/052190, mailed Jan. 28, 2020 (10 pages).
(Continued)

*Primary Examiner* — Nael N Babaa
(74) *Attorney, Agent, or Firm* — Osha Bergman Watanabe & Burton LLP

(57) ABSTRACT

The invention relates to a device (200) for thermal processing of at least one electrical element placed in a chamber (120) and liable to get hot, the thermal processing device (200) comprising at least one first circuit configured to be passed through by a heat-transfer fluid and at least one second circuit configured to be passed through by a dielectric fluid, characterised in that the first circuit and the second circuit are at least partially bounded by a face placed facing the chamber (120). The invention also relates to an electrical
(Continued)

device (100) comprising a casing (110), a plurality of electrical elements liable to get hot and a thermal processing device (200). The invention relates to a method for cooling a plurality of electrical elements liable to get hot of an electrical device (100).

14 Claims, 4 Drawing Sheets

(51) Int. Cl.
  *H01M 10/625* (2014.01)
  *H01M 10/6556* (2014.01)
  *H01M 10/6569* (2014.01)
  *H01M 50/204* (2021.01)
  *H05K 7/20* (2006.01)

(52) U.S. Cl.
  CPC ..... *H01M 10/625* (2015.04); *H01M 10/6556* (2015.04); *H01M 50/204* (2021.01); *H05K 7/20218* (2013.01); *H01M 2220/20* (2013.01)

(56) References Cited

FOREIGN PATENT DOCUMENTS

| | | |
|---|---|---|
| CN | 203279429 U | 11/2013 |
| FR | 3037727 A3 | 12/2016 |

OTHER PUBLICATIONS

Office Action issued in Corresponding Chinese Application No. 201980089333.7; dated Nov. 23, 2023 (17 pages with English Translation).

Marcus Vinicius P. Carneiro et al. "A compact refrigeration system based on multijet sprays for electronics thermal management", Experimental Thermal and Fluid Science, vol. 97, pp. 180-191, Mar. 13, 2018. (12 Pages).

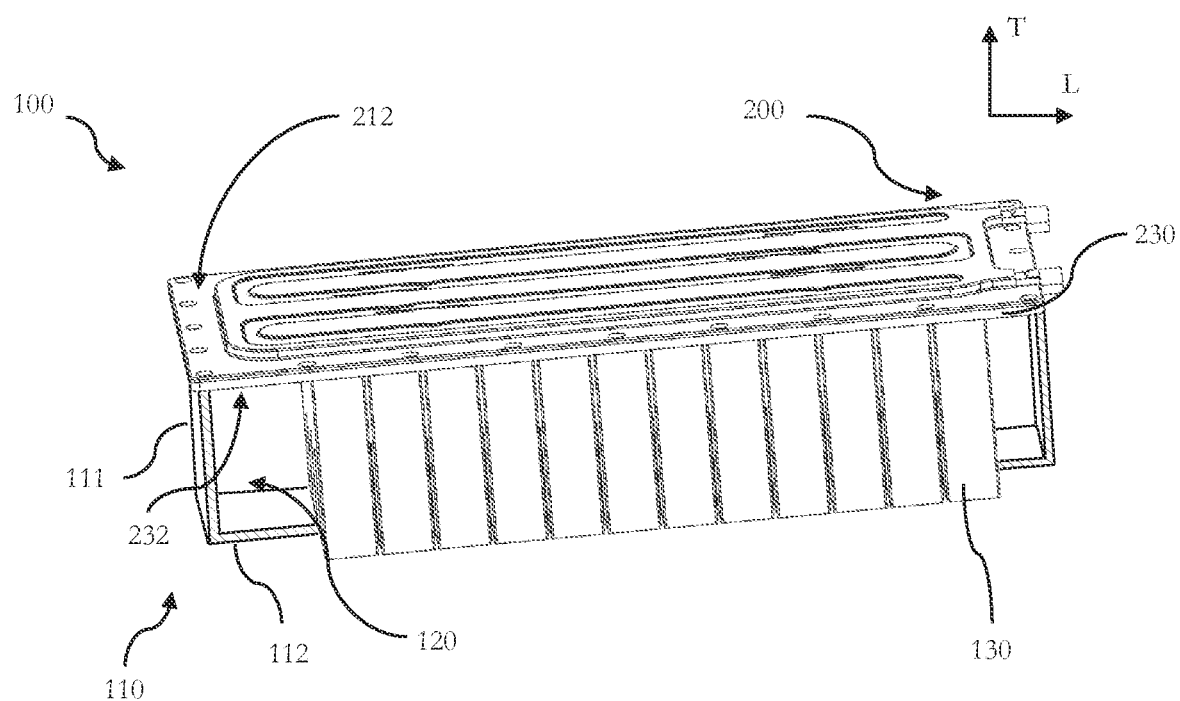
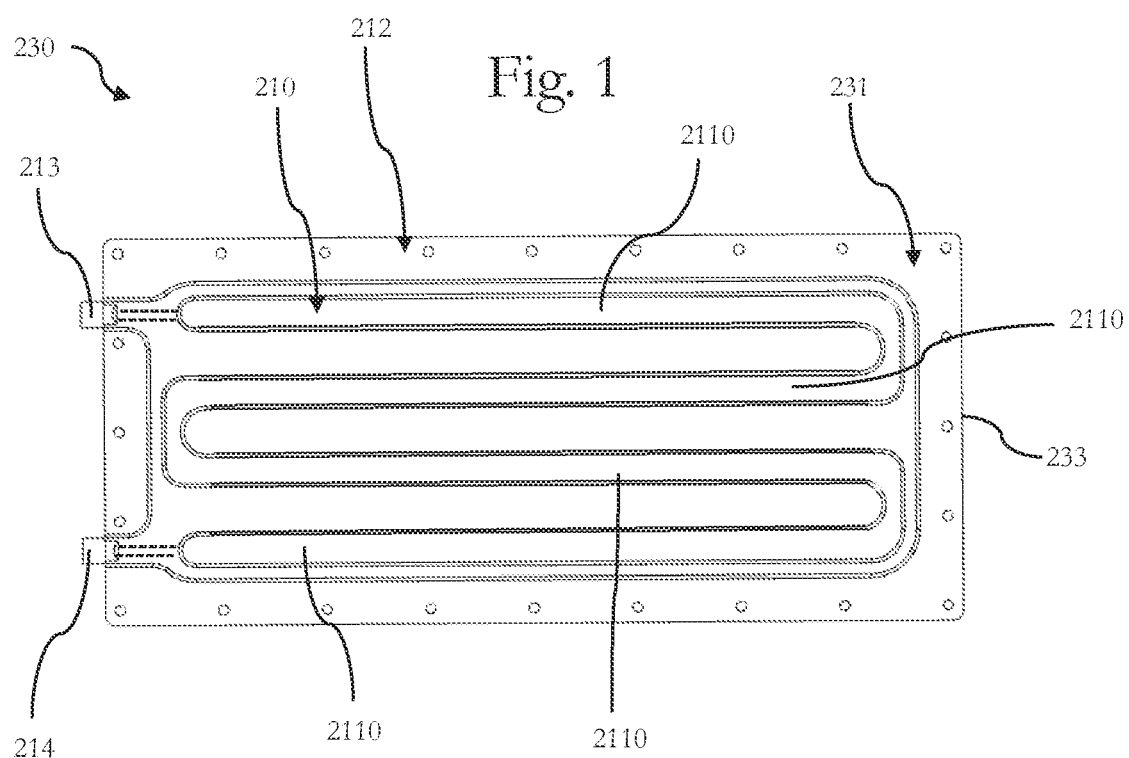
Fig. 1
Fig. 2

DEVICE FOR THERMAL PROCESSING OF AN ELECTRICAL ELEMENT LIABLE TO GET HOT AND METHOD IMPLEMENTING THE THERMAL PROCESSING DEVICE

TECHNICAL FIELD

The present invention lies in the field of devices for cooling electrical elements liable to get hot, and relates more specifically to devices for thermal processing of motor vehicle electrical storage systems.

PRIOR ART

In the field of motor vehicles, cooling/heating devices are used to reduce or increase the temperature of a set of batteries as necessary. In general, such devices for cooling/heating electric batteries use cooling exchangers. These batteries are cooled by means of a cold plate inside which a cooling liquid circulates. However, the cooling exchangers lead to a non-homogeneous cooling of the batteries of the battery set, resulting in a decrease of the service life of said batteries and also of their performances.

In order to solve this problem of non-homogeneous cooling of batteries, a number of systems are known.

In particular, document FR3037727 is known, in which a device for cooling batteries of electric or hybrid cars is disclosed. More specifically, this document relates to a device for cooling the cells of the batteries of the lithium-ion-type battery pack. The device comprises a hermetically sealed housing, in which a two-phase fluid circulates and which has an air layer. The electrical storage cells are partially immersed in the two-phase fluid in order to ensure the heat exchange between the cells and the two-phase fluid. Thus, the batteries are cooled by immersing the cells of the batteries in said fluid. The reserve of two-phase liquid consists of a tray located outside the housing and connected to said housing in order to allow the two-phase fluid to circulate.

However, immersing the electrical storage cells in a fluid, in particular a dielectric fluid, does not always allow homogeneous cooling of the cells.

The object of the invention is to improve the cooling of a battery set by overcoming the aforementioned problems of the prior art, by proposing a thermal processing device that cools, moreover with a good homogeneity of the temperature of the treated electrical element, thus optimizing the service life and the performance of such an electrical element, in particular an electrical storage device for a motor vehicle.

The invention also proposes an electrical device composed of a housing, a plurality of electrical elements liable to get hot, and a thermal processing device according to the first object of the invention.

The invention lastly relates to a method for cooling a plurality of electrical elements liable to get hot and to a method according to the second object of the invention.

DISCLOSURE OF THE INVENTION

The present invention relates to a device for thermal processing of at least one electrical element disposed in a chamber and liable to get hot, the thermal processing device comprising at least one first circuit configured to be passed through by a heat-transfer fluid and at least one second circuit configured to be passed through by a dielectric fluid sprayed into the chamber.

Specifically, the first circuit and the second circuit are at least partially delimited by a face disposed facing the chamber.

This face allows the dielectric fluid to be sprayed within the chamber. Moreover, the thermal processing device allows the condensation of said dielectric fluid after spraying and evaporation. The thermal processing device thus performs two functions: the spraying of the dielectric fluid and the condensation of same.

The thermal processing device is intended to close a housing composed of at least three side walls and a base wall. The thermal processing device delimits, with the housing, a chamber in which there is housed at least one electrical element liable to get hot. This electrical element can, for example, correspond to at least one electrical storage cell.

The thermal processing device comprises a circuit in which a heat-transfer fluid flows. This heat-transfer fluid allows the dielectric fluid to be cooled by contact, so that the latter condenses. Moreover, the thermal processing device comprises a second circuit. A dielectric fluid flows in this second circuit. The second circuit allows the spraying of the dielectric fluid within the chamber.

The second circuit is disposed on a face of the thermal processing device such that, when said thermal processing device is positioned on the housing, said second circuit is oriented towards the chamber.

The same is true for the first circuit, which has at least one face oriented towards the chamber.

According to another feature of the invention, the thermal processing device comprises at least one plate provided with at least one cavity which constitutes at least part of the first circuit and at least one cell which at least partially delimits the second circuit.

This plate is provided with two large parallel, or substantially parallel faces, referred to as an upper face and lower face. The first circuit opens out on the upper face of the plate, whereas the second circuit opens out on the lower face of the plate.

The first circuit consists of at least one cavity extending through the thickness of the plate. This cavity is serpentine-shaped and extends over the entire upper face of the plate.

The second circuit consists of at least one cell, advantageously but not limitatively, three cells arranged in the thickness of the plate. These cells are oblong in shape and extend parallel to each other at least in pairs. Further advantageously, these cells are juxtaposed to the first circuit.

According to another feature of the invention, the face disposed facing the chamber is at least partially formed by the plate.

In other words, the plate is placed on one edge of the side walls delimiting the chamber, the face facing the chamber being the face comprising the second circuit of the plate.

According to another feature of the invention, the thermal processing device comprises alternating cavity and cell branches disposed in a main plane of the plate.

The main plane of the plate is the longitudinal and transverse plane in which the majority of the plate of the thermal processing device extends. The first serpentine-shaped circuit extends on the upper face of the plate, in the longitudinal plane. This first circuit comprises a plurality of branches. The second circuit extends on the lower face of the plate, in the longitudinal plane. This circuit comprises a cell. The branches of the cavity of the first circuit and the cells of the second circuit are juxtaposed to each other and intermingled so as to be alternating.

According to another feature of the invention, at least one plane passes through at least the cavity and through at least the cell.

The cavity forming the first circuit and at least one of the cells forming the second circuit have a common plane. In other words, the cavity of the first circuit and the cell of the second circuit intersect in this common plane. Seen in the main plane of the plate and along a transverse direction perpendicular to the longitudinal axis, there are arranged a branch of the first circuit, then a cavity of the second circuit, then another branch of the first circuit, then a cell of the second circuit, then another branch of the first circuit and finally a third cell of the second circuit.

According to another feature of the invention, the thermal processing device comprises at least one lid, the lid and the plate delimiting the first circuit. This lid is advantageously of the same dimensions as the plate. The latter is disposed on the upper face of the plate, so as to cover the plate and the branches of the first circuit. Thus, the cover allows said first circuit to be closed, and ensures its sealing.

Advantageously, this lid comprises a channel, which follows the path of the first circuit. This channel, once the lid is in position on the plate, makes it possible to delimit the first circuit on the plate. Indeed, the branches combined with the channel constitute the passage of the heat-transfer fluid in the first circuit.

According to another feature of the invention, the thermal processing device comprises a closure cover, the closure cover and the plate delimiting the second circuit at least in part.

The closure cover can form the lower face of the plate that faces towards the chamber. Advantageously, the closure cover consists of a strip inserted into the cavity forming the second circuit. Such a strip is advantageously rectilinear.

This strip can be provided with at least one lug allowing it to be fixed on the plate of the thermal processing device. Advantageously, the strip is provided with four ears, arranged in pairs at each end of the strip. The lugs then comprise at least one orifice for fixing to the plate.

Each closure cover is provided with at least one bore allowing the passage of a spraying means. This spraying means can correspond in particular to a nozzle. Advantageously, the closure cover comprises four bores allowing the passage of four nozzles.

At one of its longitudinal ends, the closure cover comprises an orifice allowing the entry of dielectric fluid into the second circuit.

According to a further feature of the invention, the face disposed facing the chamber is at least partially formed by at least the closure cover.

The closure cover housed in the cell, together with the plate, delimits the second circuit. Thus, the closure cover, which forms part of the lower face of the plate, is also arranged facing the chamber. The plate and the one or more closure covers form at least part of the face disposed facing the chamber.

According to another feature of the invention, the thermal processing device comprises a heat-transfer fluid inlet port and a heat-transfer fluid outlet port both in communication with the first circuit.

The thermal processing device formed by the plate is provided at one longitudinal end of the plate with the inlet port for the heat-transfer fluid. This inlet port comprises a bore extending into the edge of the plate. This bore allows the passage of the fluid through the thickness of the plate. In addition, the bore extends from the edge of the plate to the cavity forming at least a portion of the first circuit. Thus, the bore allows the heat-transfer fluid to be received in the plate of the thermal processing device and to be routed to the cavity forming at least part of this first circuit.

The plate includes an outlet port for the heat-transfer fluid of the first circuit. This outlet port comprises a bore extending into the edge of the plate at the longitudinal end of the plate that already receives the inlet port. This bore is in communication with the cavity of the first circuit of the plate. It allows the passage of fluid through this edge of the plate from the first circuit to the outside of the plate.

According to another feature of the invention, the thermal processing device comprises at least one spraying means that communicates with the second circuit, the spraying means being configured to spray the dielectric fluid into the chamber.

According to an exemplary embodiment, the spraying means is a nozzle allowing the spraying of the dielectric fluid inside the chamber, in which the electrical storage cells are arranged. Thus, the spraying of the dielectric fluid by means of the nozzle allows a cooling of the battery cells, by vaporization of the dielectric fluid in contact with the external walls of the electrical storage cells.

The nozzle is in fluid communication with the second circuit of the thermal processing device, said nozzle being directly fixed to the plate or to the closure cover of the second circuit. The dielectric fluid conveyed in said second circuit is thus sprayed, via the nozzles, into the chamber. According to one example, these nozzles can be configured to generate a mist of the dielectric fluid.

According to another feature of the invention, the thermal processing device includes a dielectric fluid inlet opening that communicates with the second circuit, with the spraying means forming a dielectric fluid outlet opening.

According to one example, the inlet opening is provided in the closure cover which delimits the second circuit. The spraying means, formed for example by one or more nozzles, allows the spraying of the dielectric fluid conveyed in the second circuit onto the electrical storage cells housed in the chamber. The one or more nozzles thus form an outlet opening for the dielectric fluid in the second circuit of the thermal processing device.

The invention also relates to an electrical storage device comprising a housing, a plurality of electrical storage cells and a thermal processing device according to one of the preceding features, the housing and the thermal processing device delimiting a chamber in which the electrical element liable to get hot is housed.

The electrical storage device comprises a housing formed of at least three side walls and a base wall. The base wall extends perpendicular to the side walls from a first end thereof.

The chamber is delimited by these side walls and this base wall of the housing. Said chamber houses the electrical storage cells. The thermal processing device, in particular the plate, extends supported on a free edge of the side walls of the housing. The plate thus placed seals the chamber.

According to another feature of the invention, a base wall of the housing forms a reserve of dielectric fluid. Indeed, once the dielectric fluid has been condensed by the plate, in particular by means of the first circuit, it falls by gravity to the bottom of the housing and the base wall then forms a reserve of the dielectric fluid.

The dielectric fluid is sprayed onto the electrical storage cells contained in the chamber of the thermal processing device. After spraying, the dielectric fluid may evaporate on contact with the electrical storage cells, then may condense on contact with the face of the plate facing the chamber, and finally accumulate in a liquid state on the base wall of the housing.

According to another feature of the invention, the thermal processing device is configured to spray the dielectric fluid into the chamber and to condense said dielectric fluid in the chamber.

The invention also relates to a method for cooling a plurality of electrical storage cells of an electrical storage device which has the above features, comprising a step of spraying dielectric fluid towards the electrical storage cells, a step of evaporating the dielectric fluid in contact with the electrical storage cells, and a step of condensing the dielectric fluid in contact with the face disposed facing the chamber.

The objective of the cooling method is to cool the electrical storage cells of the electrical storage device by means of a closed circuit within the chamber, the dielectric fluid of which changes state. This method comprises a number of steps, including a step of spraying the dielectric fluid onto the electrical storage cells. As these cells are hot, the dielectric fluid, upon contact therewith, evaporates and rises towards the lower face of the plate which faces the chamber of the thermal processing device. Then, on contact with this face, the dielectric fluid condenses, to be sprayed again on the electrical storage cells, thus forming a cooling cycle with two changes of state.

DESCRIPTION OF THE FIGURES

Further features and advantages of the invention will become clearer from the following description, on the one hand, and from several exemplary embodiments, which are provided for information and in a non-limiting manner with reference to the accompanying schematic drawings, on the other hand, in which drawings:

FIG. 1 shows a perspective view of an electrical storage device according to the invention, comprising a housing shown in section so as to be able to see the electrical storage cells;

FIG. 2 shows a view from below of the thermal processing device according to the invention;

Figure 3:
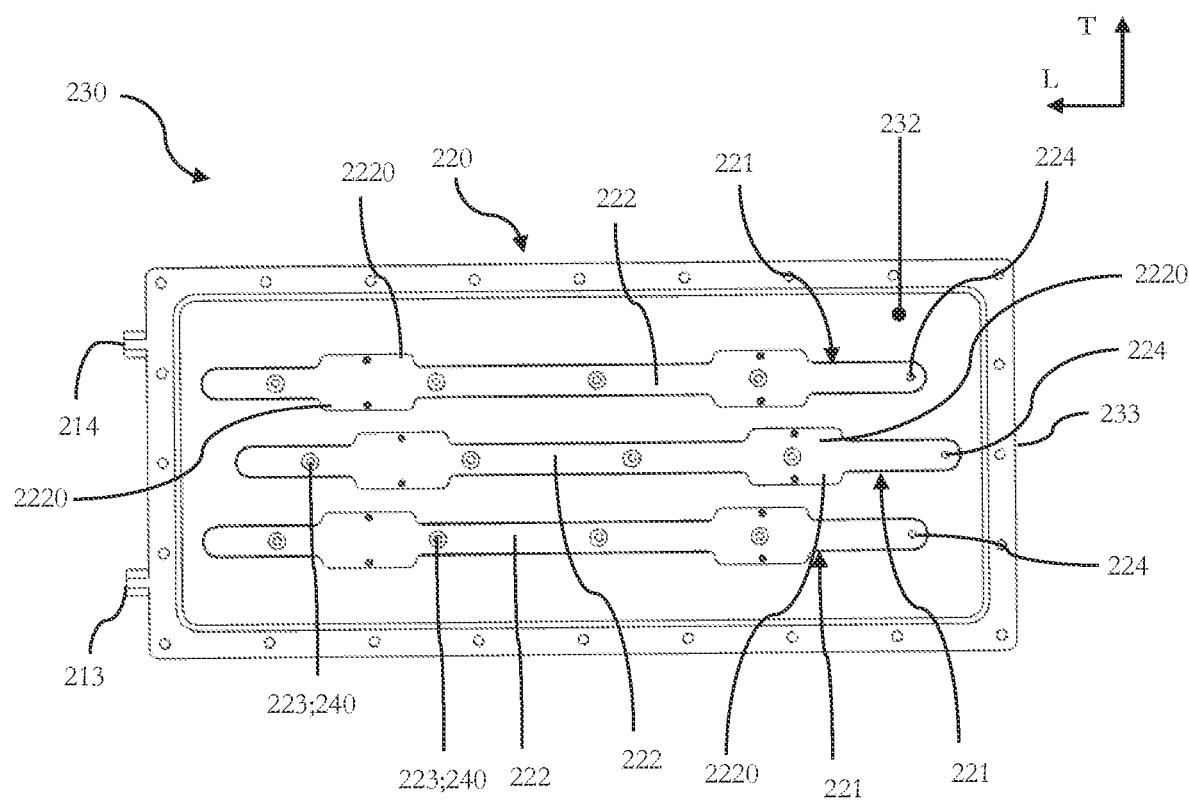
FIG. 3 shows a view from below of the thermal processing device according to the invention.

The features, variants and the different embodiments of the invention can be combined with one another, in various combinations, provided that they are not mutually incompatible or exclusive. In particular, alternative embodiments of the invention can be contemplated that only comprise a selection of features that are described hereafter independently of the other described features, if this selection of features is sufficient to provide a technical advantage or to differentiate the invention from the prior art.

In particular, all the alternatives and all the embodiments described can be combined together if there are no technical obstacles to this combination.

In the figures, elements common to several figures keep the same reference sign.

DETAILED DESCRIPTION OF THE INVENTION

As can be seen in FIG. 1, the invention relates to an electrical storage device loft This electrical storage device 100 comprises a housing 110. The housing 110 comprises at least three side walls 111 and a base wall 112.

According to a particular embodiment of the invention visible in FIG. 1, the housing 110 comprises four side walls 111, arranged in parallel in pairs. The base wall 112 extends perpendicularly to the side walls 111, from one of their edges. A thermal processing device 200 is placed against a free edge of the side walls 111 of the housing 110. The thermal processing device 200, the side walls 111 and the base wall 112 of the housing 110 together delimit a chamber 120. The internal volume of this chamber 120 may be sealed with respect to the environment outside the housing 110.

At least one electrical storage cell 130 is housed within this chamber 120. According to the example shown in FIG. 1, there are provided a plurality of electrical storage cells 130 aligned next to each other, said electrical storage cells 130 having peripheral walls that extend perpendicular to the thermal processing device 200, and two end walls that extend parallel to the thermal processing device 200.

FIG. 1 shows a partial sectional view of the housing 110 in which the electrical storage cells 130 are housed and on which the thermal processing device 200 is disposed. The partial cross-sectional view of the housing 110 makes visible the chamber 120 formed by the side walls 111, the base wall 112 and the thermal processing device 200, as well as the electrical storage cells 130.

According to a particular embodiment of the invention, twelve electrical storage cells 130 are juxtaposed to each other and are disposed in chamber 120 of housing 110. The electrical storage cells 130 are centered as a whole in the housing 110 with respect to the thermal processing device 200.

The base wall 112 of the housing 110 at least partially forms a reservoir that extends along the main plane of said base wall 112. The main plane of the base wall 112 corresponds to a plane in which said base wall 112 extends predominantly. Thus, the base wall 112 forms a reserve, configured to receive a dielectric fluid.

The invention also relates to a device 200 for the thermal processing of at least one electrical element liable to get hot. In the case in point, the electrical element liable to get hot is the electrical storage cell or cells 130, but the invention extends to the cooling of any electrical component, in particular a component which participates in the electrical drive train of a vehicle, such as a power electronics housing, an electrical converter, a cable harness, etc.

As illustrated in FIG. 2, the thermal processing device 200 includes at least one plate 230. This plate 230 extends longitudinally between a first longitudinal end (233) and a second longitudinal end (234). The plate 230 is rectangular in shape and extends predominantly in a plane that lies in a longitudinal direction L and in a transverse direction T. The plate 230 comprises an upper face 231 that faces outwardly from the housing 110. The plate 230 also includes a lower face 232 visible in FIG. 3, oriented towards the chamber 120, once the plate 230 is placed against the edges of the side walls 111 of the housing 110.

As seen in FIG. 2, the thermal processing device 200 comprises a first circuit 210. This first circuit 210 is configured to be passed through by a heat-transfer fluid.

The first circuit 210 comprises at least one cavity 211. This cavity 211 extends on the upper face 231 of the plate 230, in the thickness of the plate. This first circuit 210 is advantageously serpentine-shaped and extends over all or part of the plate 230, forming a multi-branched meander (2110).

The thermal processing device 200, and more particularly the plate 230 at its upper face 231, comprises an inlet port 213 for the heat-transfer fluid. This inlet port 213 is disposed on a longitudinal end 233 of the plate 230 forming a longitudinal end of the plate 230. This inlet port 213 consists of a bore formed in the thickness of the plate 230 and allowing the heat-transfer fluid to be routed towards the first circuit 210. Thus, the inlet port 213 communicates with the cavity 211 of the first circuit 210.

The thermal processing device 200, and more particularly the plate 230 on its upper face 231, comprises an outlet port 214 for the heat-transfer fluid. This outlet port 214 is disposed, according to the example illustrated here, on the first longitudinal end 233 of the plate 230. The outlet port 214 consists of a bore formed in the thickness of the plate 230 and allows the heat-transfer fluid to exit the first circuit 210. Thus, the outlet port 214 communicates with the cavity 211 of the first circuit 210.

The first circuit 210 thus allows the plate 230 to be cooled, and thus the face (232) of the plate 230 facing the chamber to be held at a temperature below a condensation temperature of the dielectric fluid, which ensures that upon contact with it, this dielectric fluid changes to the liquid state.

As seen in FIG. 3, the thermal processing device 200 comprises a second circuit 220. This second circuit 220 is configured to have the dielectric fluid pass through it. FIG. 3 shows the thermal processing device 200 from a viewpoint opposite that of FIG. 2. The face (232) facing the chamber is therefore clearly visible.

The second circuit 220 comprises at least one cell 221. This cell 221 extends through the thickness of the plate 230 and opens out onto the lower face 232 thereof. The lower face 232 is here the face that faces the chamber. This second circuit 220 advantageously, but not limitatively, comprises three cells 221. These cells 221 extend longitudinally, along all or part of the length of the plate 230.

As illustrated in FIG. 3 and according to a particular embodiment of the invention, the cells 221 are placed equidistant from each other and substantially centered in the transverse dimension T of the plate 230.

Each cell 221 is closed by a closure cover 222, which takes the form of a straight strip, for example. The closure cover 222 of the second circuit 220 is housed in the cell 221.

Advantageously, the cells 221 are in the form of longitudinal openings having at least one clearance configured for the fixing of a closure cover 222. According to a particular embodiment of the invention, each cell 221 comprises four clearances allowing the fixing of the closure cover 222.

As illustrated in FIG. 3, the closure cover 222 consists of a strip comprising lugs (2220) for fixing to the cell 221 of the second circuit 220. Advantageously, each closure cover 222 comprises four fixing lugs (2220). The closure cover 222 is configured to move into position within the cell 221 of the second circuit 220 in a sealed manner so that the dielectric fluid circulating in the second circuit 220 is channeled to a particular outlet.

Preferably, the closure cover 222 comprises on its periphery a seal allowing, when it is positioned in the cell 221, the sealing of the second circuit 220 with respect to the plate 230. The closure cover 222 as well as the plate 230 in which the cell 221 extends, thus delimit the second circuit 220 of the thermal processing device 200.

It will be noted that the second circuit 220 extends so as to be in contact with the lower face 232 of the plate 230. Thus, the lower face 232 of the plate 230, which is disposed facing the chamber 120, is at least partially formed by said closure cover 222, then housed in the relevant cell 221. In other words, the lower face 232 of the plate 230 together with the closure cover 222 form the face disposed facing the chamber 120.

Furthermore, the thermal processing device 200 according to the invention comprises at least one spraying means 240. This spraying means 240 advantageously consists of a nozzle.

This spraying means 240 is in fluid communication with the second circuit 220. Indeed, the spraying means 240 is configured to spray or mist the dielectric fluid into the chamber 120.

According to a particular embodiment of the invention, the spraying means 240 is machined into the closure cover 222, which then comprises an opening for the passage of dielectric fluid through the closure cover 222 so that it can be sprayed into the chamber 120.

According to another embodiment of the invention, the spraying means 240 is attached to the closure cover 222, which in turn comprises a thread into which a nozzle head is screwed so that the dielectric fluid can be sprayed into the chamber 120.

According to another embodiment of the invention, the spraying means 240 is machined in the plate 230, the latter then not comprising a closure cover to delimit the second circuit 220. In such a configuration, the spraying means 240 communicates with the second circuit 220 by passing through the face 232 facing the chamber so that the spraying means can be supplied with dielectric fluid and can then spray said fluid into the chamber 120 subsequently.

It is conceivable to have machined spraying means 240 combined with spraying means 240 attached to the plate 230 and/or to the closure cover 222.

This spraying means 240 for conveying dielectric fluid from the second circuit 220 to the chamber 120 of the electrical storage device 100 then constitutes an outlet for the dielectric fluid 223 from the second circuit 220.

Advantageously, the second circuit 220 comprises a plurality of spraying means 240 disposed along all or part of the length of the second circuit 220.

According to an exemplary embodiment, the thermal processing device 200 includes a dielectric fluid inlet opening 224. This inlet opening 224 communicates with the second circuit 220 to allow the dielectric fluid to be conveyed to the cell 221 of the second circuit 220. This inlet opening 224 consists of an orifice located at a longitudinal end of the second circuit 220.

Advantageously, in the second circuit 220 composed of a plurality of cells 221 as well as a plurality of closure covers 222, each closure cover 222 comprises an inlet opening 224 for the dielectric fluid, the inlet openings 224 being disposed along the second longitudinal end 234 of the plate 230 opposite the first longitudinal end 233 which receives the inlet port 213 and the outlet poll 214 of the first circuit.

Figure 4:
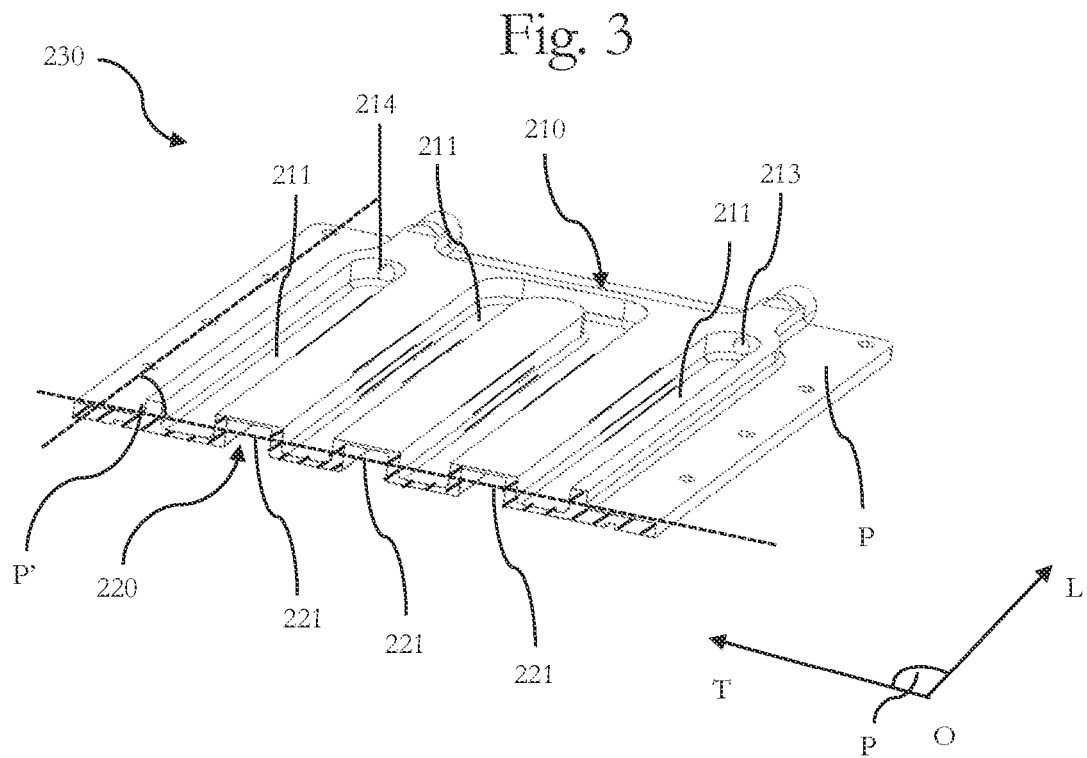
FIG. 4 shows a perspective view of a section through the thermal processing device according to the invention.

As can be seen in FIG. 4, the plate 230 of the thermal processing device 200 comprises alternating cavity 211 and cells 221 organized along the transverse dimension T, in a main plane P of the plate 230.

FIG. 4 is a cross-sectional view of the plate 230 of the thermal processing device 200, devoid of its lid and closure covers. The cavity 211 of the first circuit 210 is juxtaposed with the cell 221 of the second circuit 220, the branches of the cavity 211 alternating with the cells 221, each opening out respectively on the upper face 231 and on the lower face 232 of the plate 230.

Furthermore, at least one plane P' passes through at least the cavity 211 and through at least one cell 221. The cavity 211 and the cell 221 thus have a common plane P'. Advantageously, this plane P' passes through all the branches (2110) that form the cavity 211 of the first circuit 210, as well as through all the cells 221 of the second circuit 220.

Figure 5:
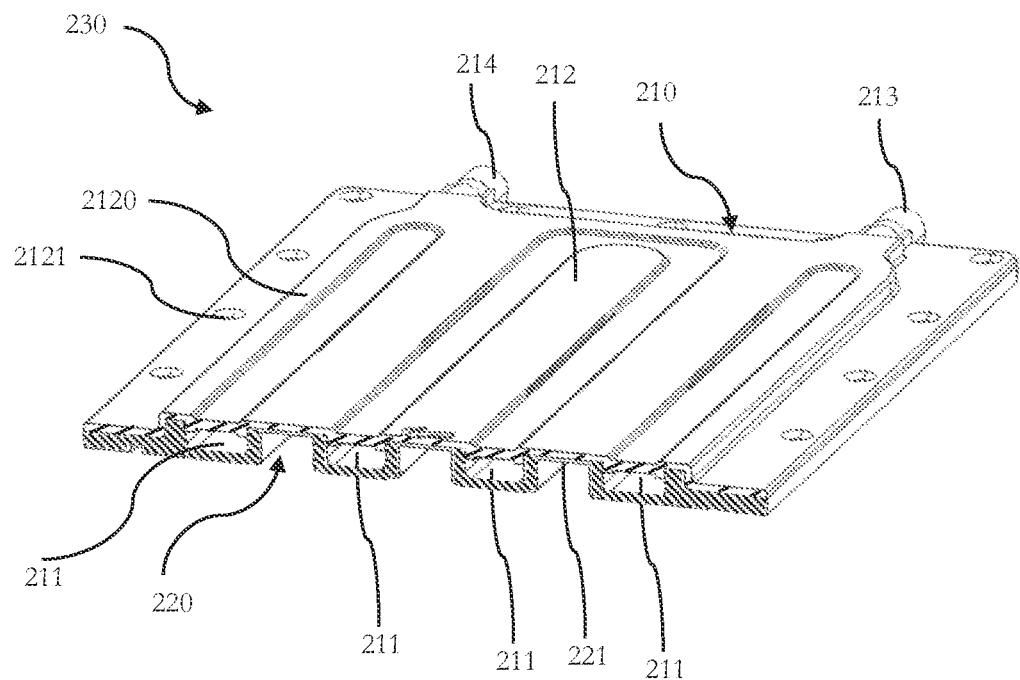
FIG. 5 shows a perspective view of a section of the thermal processing device according to the invention fitted with its plate and its lid.

As illustrated in FIG. 5, a lid 212 is advantageously disposed on the upper face 231 of the plate 230. The lid 212 conforms to the shape of the plate 230 and has at least one channel 2120 along the cavity 211 forming the first circuit 210. This channel 2120 in collaboration with the cavity 211 formed in the plate 230 makes it possible to delimit the first circuit 210.

The channel 2120 in the lid 212 is obtained by deforming the material of the lid 212, for example, as a result of a stamping operation of the lid 212.

The lid 212 of the first circuit 210 comprises holes 2121 on all or part of its periphery, which holes are intended to receive fixing means, allowing the lid 212 and the plate 230 of the thermal processing device 200 to be held in position on the housing.

Figure 6:
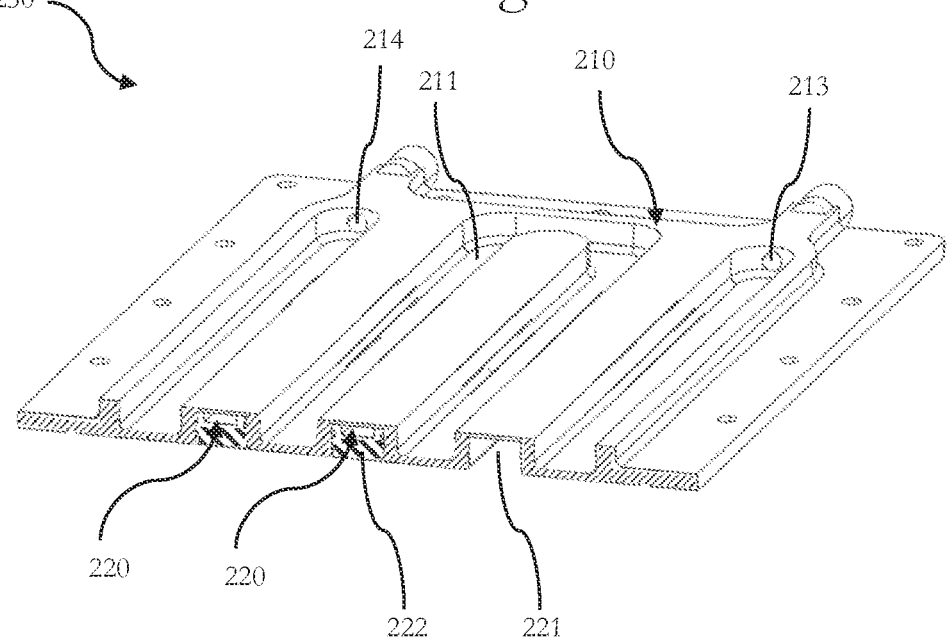
FIG. 6 shows a perspective view of a section of the thermal processing device according to the invention fitted with its plate and closure covers.

Additionally, as seen in FIG. 6, the closure cover 222 is housed within the cells 221 of the second circuit 220. The closure cover 222 and the cells 221 delimit the second circuit 220.

The cross-sectional view of the thermal processing device 200 with its plate 230 and two closure covers 222 housed in two cells 221 of the second circuit 220 illustrates the passage of the dielectric fluid.

Figure 7:
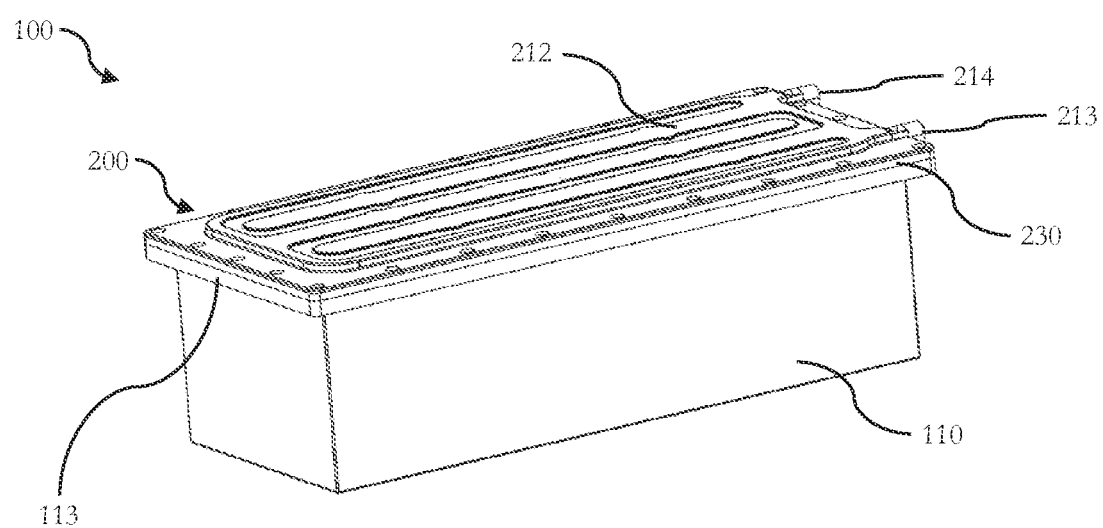
FIG. 7 shows a perspective view of the electrical storage device comprising the housing and the thermal processing device according to the invention.

The thermal processing device 200 on which the lid 212 is supported and in which the closure covers 222 of the second circuit 220 are housed is disposed on a docking edge 113 of the housing 110, as visible in FIG. 7. The invention also relates to a method for cooling an electrical element liable to get hot, such as a plurality of electrical storage cells 130, for example. The electrical storage cells 130 assembled as shown in FIGS. 1 to 7 form an electrical storage element configured to deliver electrical energy capable of setting a motor vehicle in motion.

This cooling method comprises a step of spraying the dielectric fluid towards the electrical storage cells 130 housed in the chamber 120, then a step of evaporating the dielectric fluid in contact with the electrical storage cells 130 and a step of condensing the dielectric fluid in contact with the face 232 disposed facing the chamber 120. This method can be completed by a step of accumulating the dielectric fluid in the liquid state on the base wall 112 of the housing 110, and a step of pumping this dielectric fluid to send it into the second circuit 220, so that it is sprayed again.

The dielectric fluid is drawn in by a pump advantageously housed in the electrical storage device 100. The dielectric fluid is then conveyed from the pump to the plate 230 of the thermal processing device 200. The dielectric fluid enters the second circuit 220 through the inlet opening 224 of the second circuit 220, to flow between the cell 221 and the closure cover 222 housed in this cell 221. The dielectric fluid then passes through the spraying means 240 to be sprayed or misted within the chamber 120 of the electrical storage device 100. The chamber 120 of the electrical storage device 100 houses the electrical storage cells 130 with which the sprayed dielectric fluid comes into contact. Because the electrical storage cells 130 are at a temperature above the evaporation temperature of the dielectric fluid, the dielectric fluid evaporates, recovering heat from the electrical storage cells 130 by change of state. The dielectric fluid in the gaseous state then comes into contact with at least a portion of the lower face 232 of the plate 230 of the thermal processing device 200. Upon contact with this face, the temperature of which is lower than the condensation temperature of the dielectric fluid, the gas formed by the dielectric fluid condenses.

Thus, the plate 230 of the thermal processing device 200 has a dual functionality, having both a means 240 for spraying the dielectric fluid and a means for condensing the same dielectric fluid.

In the above description, the heat-transfer fluid can consist of a glycoled water-type heat-transfer fluid. It can also consist of a cooling fluid. As far as the dielectric fluid is concerned, it is a fluorine-based fluid of which the evaporation temperature at atmospheric pressure is higher than 32, 33 or 34 degrees Celsius, and the condensation temperature of which is lower than 31, 30 or 29 degrees Celsius.

The present invention therefore provides a simple means of effectively cooling a heating electrical element, thereby improving the longevity and reliability of this element, particularly by improving the temperature homogeneity within the chamber.

However, the present invention is not limited to the means and configurations described and illustrated herein and it also extends to all equivalent means and configurations and to any technically functional combination of such means. In particular, the shape and the arrangement of the plate, of the spraying means, and of the first and second circuits may be modified without detriment to the invention, provided that they satisfy the functionalities described in the present document.

The invention claimed is:

1. A device for thermal processing of at least one electrical element disposed in a chamber and liable to heat up,
the thermal processing device comprising:
at least one first circuit configured to be passed through by a heat-transfer fluid; and
at least one second circuit configured to be passed through by a dielectric fluid sprayed into the chamber,
wherein the first and second circuits are fluidically separated; and
at least one plate comprising the first circuit on a first face and the second circuit on a second face opposite from the first face,
wherein the first circuit and the second circuit are at least partially delimited by the at least one plate, wherein the second face is disposed facing the chamber.

2. The thermal processing device as claimed in claim 1, wherein the at least one plate is provided with at least one cavity which constitutes at least part of the first circuit and at least one cell which delimits at least part of the second circuit.

3. The thermal processing device as claimed in claim 2, in which the second face is disposed facing the chamber is at least partially formed by the plate.

4. The thermal processing device as claimed in claim 3, comprising alternating cavity and cell branches disposed in a main plane of the plate.

5. The thermal processing device as claimed in claim 4, in which at least one plane P' passed through at least one cavity and through at least one cell.

6. The thermal processing device as claimed in claim 1, further comprising at least one cover, the cover and the plate delimiting the first circuit.

7. The thermal processing device as claimed in claim 1, further comprising a closure cover, the closure cover and the plate delimiting the second circuit at least in part.

8. The thermal processing device as claimed in claim 7, in which the second face disposed facing the chamber is formed at least in part by at least the closure cover.

9. The thermal processing device as claimed in claim 1, further comprising a heat-transfer fluid inlet port and a heat-transfer fluid outlet port both in communication with the first circuit.

10. The thermal processing device as claimed in claim 1, further comprising at least one spraying means which communicates with the second circuit, the spraying means being configured to spray the dielectric fluid into the chamber.

11. The thermal processing device as claimed in claim 1, further comprising a dielectric fluid inlet opening that communicates with the second circuit, the spraying means forming a dielectric fluid outlet opening.

12. An electrical storage device comprising:
a housing, a plurality of electrical elements liable to heat up and a thermal processing device as claimed in claim 1, the housing and the thermal processing device delimiting a chamber in which the electrical elements liable to heat up are housed.

13. The electrical storage device as claimed in claim 12, in which the thermal processing device is configured to spray the dielectric fluid into the chamber and to condense this same dielectric fluid in the chamber.

14. A method for cooling a plurality of electrical elements liable to heat up of an electrical device as claimed in claim 12, comprising:
spraying dielectric fluid towards said electrical elements;
evaporating the dielectric fluid in contact with said electrical elements; and
condensing the dielectric fluid in contact with the second face disposed facing the chamber.

\* \* \* \* \*